United States Patent
Wallace et al.

(10) Patent No.: US 9,043,189 B2
(45) Date of Patent: May 26, 2015

(54) SPACE-TIME SURROGATE MODELS OF SUBTERRANEAN REGIONS

(75) Inventors: Jon M. Wallace, Houston, TX (US); Jennifer A. Hommema, Pearland, TX (US); Kevin H. Searles, Kingwood, TX (US); Sheng-Yuan Hsu, Sugar Land, TX (US); Jing Wan, Sugar Land, TX (US); Eric R. Grueschow, Sugar Land, TX (US)

(73) Assignee: ExxonMobil Upstream Research—Law Department, Houston, TX (US)

( * ) Notice: Subject to any disclaimer, the term of this patent is extended or adjusted under 35 U.S.C. 154(b) by 654 days.

(21) Appl. No.: 12/780,377

(22) Filed: May 14, 2010

(65) Prior Publication Data

US 2011/0024125 A1 Feb. 3, 2011

Related U.S. Application Data

(60) Provisional application No. 61/229,593, filed on Jul. 29, 2009.

(51) Int. Cl.
*G06G 7/48* (2006.01)
*G06G 7/56* (2006.01)
(Continued)

(52) U.S. Cl.
CPC ............... *G01V 99/00* (2013.01); *G06T 17/05* (2013.01); *G06G 7/57* (2013.01); *G06F 17/50* (2013.01); *E21B 43/00* (2013.01); *G06G 7/50* (2013.01); *G06F 17/16* (2013.01)

(58) Field of Classification Search
CPC ........... G06F 17/50; G06F 17/16; G06G 7/57; G06G 7/50; E21B 43/00; G06T 17/05

USPC .................................................... 703/10, 5, 9
See application file for complete search history.

(56) References Cited

U.S. PATENT DOCUMENTS 4,759,636 A 7/1988 Ahern et al.
6,101,447 A 8/2000 Poe, Jr.
(Continued)

FOREIGN PATENT DOCUMENTS

WO WO 2005/071222 A1 8/2005
WO WO 2007/018858 A2 2/2007
(Continued)

OTHER PUBLICATIONS

K. Eskandari, NPL publication, "Integrating Dynamic Data into Reservoir Models: A multiple Point Perspective", Sep. 2006.*
(Continued)

*Primary Examiner* — Saif Alhija
*Assistant Examiner* — Angel Calle
(74) *Attorney, Agent, or Firm* — ExxonMobil Upstream Research—Law Department

(57) ABSTRACT

Methods for creating and using space-time surrogate models of subsurface regions, such as subsurface regions containing at least one hydrocarbon formation. The created surrogate models are explicit models that may be created from implicit models, such as computationally intensive full-physics models. The space-time surrogate models are parametric with respect to preselected variables, such as space, state, and/or design variables, while also indicating responsiveness of the preselected variables with respect to time. In some embodiments, the space-time surrogate model may be parametric with respect to preselected variables as well as to time. Methods for updating and evolving models of subsurface regions are also disclosed.

15 Claims, 9 Drawing Sheets

(51) Int. Cl.

| | | |
|---|---|---|
| *G06G 7/50* | (2006.01) | |
| *G01V 99/00* | (2009.01) | |
| *G06T 17/05* | (2011.01) | |
| *G06G 7/57* | (2006.01) | |
| *E21B 43/00* | (2006.01) | |
| *G06F 17/50* | (2006.01) | |
| *G06F 17/16* | (2006.01) | |

(56) References Cited

U.S. PATENT DOCUMENTS

| | | |
|---|---|---|
| 6,715,551 B2 | 4/2004 | Curtis et al. |
| 6,980,940 B1 | 12/2005 | Gurpinar et al. |
| 2005/0049838 A1 | 3/2005 | Danko |
| 2006/0015310 A1 | 1/2006 | Husen et al. |
| 2006/0160137 A1 | 7/2006 | Martin et al. |
| 2007/0043622 A1 | 2/2007 | Olsen et al. |
| 2007/0094187 A1 | 4/2007 | Anderson et al. |
| 2007/0168328 A1 | 7/2007 | Peralta et al. |
| 2008/0082469 A1 | 4/2008 | Wilkinson et al. |
| 2008/0162100 A1* | 7/2008 | Landa ............... 703/10 |
| 2008/0228680 A1 | 9/2008 | Chen et al. |
| 2011/0238392 A1* | 9/2011 | Carvallo et al. ........ 703/2 |

FOREIGN PATENT DOCUMENTS

| | | |
|---|---|---|
| WO | WO 2007/018860 A2 | 2/2007 |
| WO | WO 2007/018862 A2 | 2/2007 |

OTHER PUBLICATIONS

Sanjay Srinivasan, NPL publication, "Integration of production data into reservoir models: a forward modeling perspective", Thesis, Mar. 2000.*

Shahab D. Mohaghegh, NPL publication, "Development of Surrogate Reservoir Models (SRM) for Fast Tack Analysis of complex Reservoirs", Apr. 2006.*

Tarun Kashib, NPL Publication "A probabilistic approach to integrating dynamic data in reservoir models", Feb. 2006.*

Mohaghegh, S. D. et al., "Uncertainty Analysis of a Giant Oil Field in the Middle East Using Surrogate Reservoir Model", SPE 101474, Nov. 5-8, 2006, International Petroleum Exhibition & Conference, pp. 1-13, Abu Dhabi, UAE.

Queipo, N. V. et al., "Surrogate Modeling-Based Optimization of SAGD Processes", SPE 69704, Mar. 12-14, 2001, International Thermal Operations & Heavy Oil Symposium, pp. 1-9, Portamar, Margarita Island, Venezuela.

Vanegas, J. W. et al., "Uncertainty Assessment of SAGD Performance Using a Proxy Model Based on Butler's Theory", SPE 115662, Sep. 21-24, 2008, SPE Annual Technical Conference & Exhibition, pp. 1-21, Denver, CO.

* cited by examiner

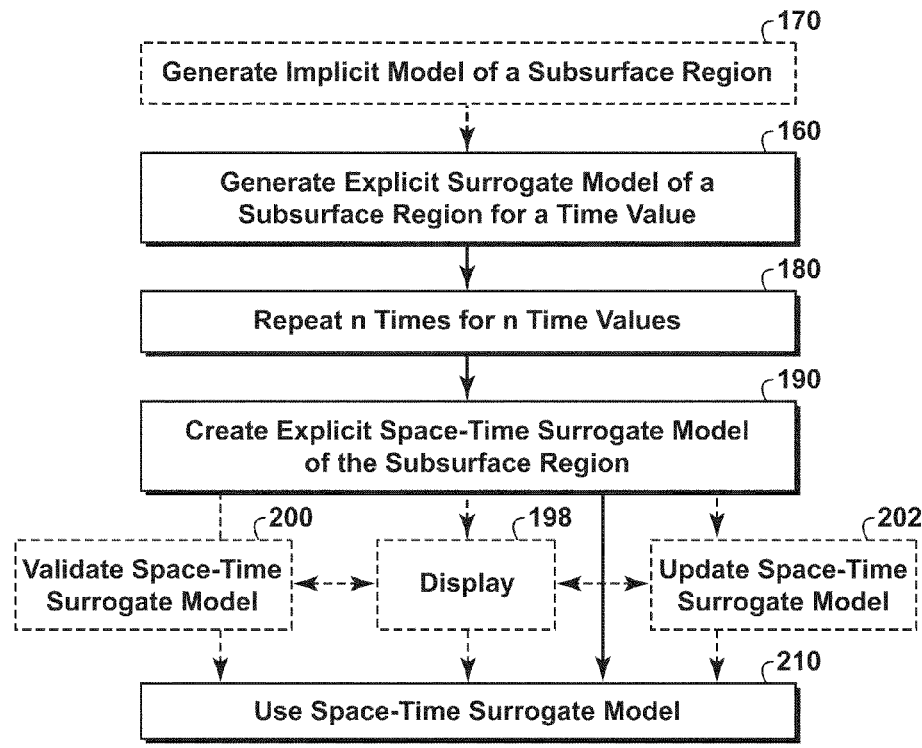
*FIG. 5*
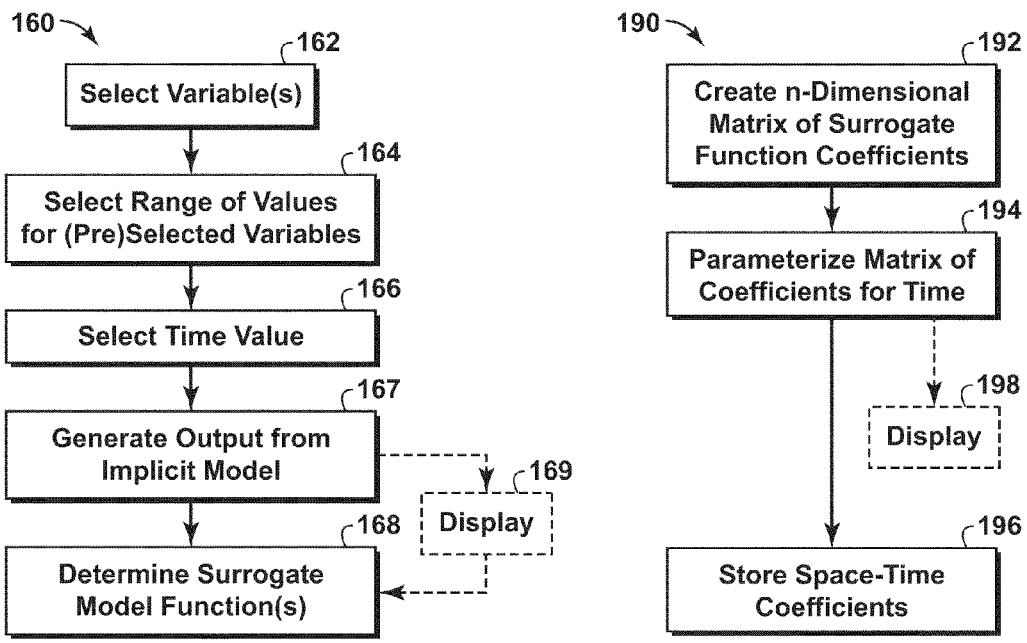
*FIG. 6*       *FIG. 7*

$$y(x) = \sum_{j=1}^{m} w_j \varphi_j \left( \| x - c_j \| \right)$$

SPACE-TIME SURROGATE MODELS OF SUBTERRANEAN REGIONS

CROSS REFERENCE TO RELATED APPLICATIONS

This application claims the benefit of U.S. Provisional Application No. 61/229,593 filed Jul. 29, 2009.

FIELD OF THE DISCLOSURE

The present disclosure is directed generally to surrogate modeling, and more particularly to systems and methods for creating and utilizing space-time surrogates of subterranean regions.

BACKGROUND OF THE DISCLOSURE

In the oil and gas field, it is important to be able to produce accurate models of subterranean, or subsurface, regions, such as of subsurface structures and features, fluids, properties, and related parameters thereof. Illustrative, non-exclusive examples of such fluids include liquid and gaseous hydrocarbons and water. Illustrative, non-exclusive examples of such parameters include temperature, pressure, permeability, porosity, shear and/or strain forces, compaction, fluid properties, subsurface formation properties, in situ reservoir conditions, Poisson's ratio, modulus of elasticity, shear modulus, strength, compressibility, combinations thereof, and the like. Illustrative, non-exclusive examples of such structures include reservoirs, wells and wellbores, well orifices, near wellbore surfaces, subsurface strata, producer fields, stimulated formation structures such as fractures and acid wormholes, and the like.

Some of the most precise information and tools are available from full-field models, which also may be referred to as full-physics models. These models are complex, fine-scale computer simulations of the subterranean region to be modeled, and may be based on the fundamental physics of the parameter(s) to be modeled in the subterranean region. The full-physics models are computationally-intensive, demanding implicit models that take significant amounts of time and resources to prepare, validate, and implement. The time required refers to the number of hours that individuals must spend to prepare, validate, and implement the model, with this time typically being performed by one or more of a relatively limited number of individuals with sufficient training and technical expertise to create these models. For example, these individuals may be highly trained individuals having expert knowledge of reservoir fluid flow mechanics, geomechanics, and mathematical modeling of dynamic bodies. In addition, the computational resources required to prepare, validate, and implement these models typically require specialized software and powerful computers.

These full-physics models may be used for such illustrative purposes as to simulate and/or predict future values, performance, responses to changes in variables, etc. of the corresponding subsurface region, or portions thereof. Specific illustrative, non-exclusive examples include modeling hydrocarbon flow from producer wells, predicting water flow, modeling injectivity of a formation, and modeling well operability limits, which may refer to the ability of a well to withstand changes in subsurface geomechanical stresses.

While very effective at accurately simulating and predicting characteristics and/or responses of the modeled subterranean region, full-physics models suffer the above-discussed limitations due to their computational and resource demands, including the time demands of highly experienced operators. Moreover, full-physics models suffer from limitations in their ability to process information in real time, as individual iterations may take many hours or days to calculate a single response. This may make it impractical to rely on these full-physics models for day-to-day decision making, such as by an operator in the field. Furthermore, new models generally must be developed for each particular well, near-wellbore, or other subsurface region of interest because full-physics models are directed to a specific application or region. However, the time and resource demands discussed above often render it impractical to conduct different simulations and/or to utilize the complicated physics-based models during each life cycle phase of a well or other subsurface region.

Other mathematical solutions exist, but they are based on stringent assumptions that are assumed to govern the interrelationship of various parameters. However, these assumptions often do not correspond to real-world subterranean conditions. For example, actual well and near-well operating conditions often deviate substantially from these assumptions. These assumptions often will include assuming that physical subterranean behavior is linear, or nearly linear, and that properties are constant and homogenous. As with the above-described fine-scale models, complicated numerical models may be developed to predict non-ideal behavior of subterranean surfaces. However, these models also are computationally complex and require operators with extensive training and experience. Moreover, these models are unique to particular parameters, such as geometry, properties, and boundary conditions.

More recently, surrogate representations, or models, of such fine-scale computer models have been developed. Surrogate modeling refers to the creation of representations of fine-scale computer models. Surrogate models are explicit mathematical functions that emulate, or mimic, the responses of implicit full-physics (fine-scale) models with high accuracy, but which are able to generate responses in a fraction of the time required to generate a response from the full-physics model from which the surrogate model was generated.

Surrogate models are useful tools, especially for field personnel and other users who may lack the time, expertise, and/or computational resources to utilize fine-scale computer models. As such, surrogate models have proven to be extremely useful for real-time, in-field analysis and decision-making For example, surrogate models may be distributed to front end users involved with well design and evaluation, enabling these users to perform high-end engineering analysis with minimal effort. In other words, surrogate models may be used to deliver high-end modeling capability to front-end (i.e., in the field) users. Illustrative, non-exclusive examples of conventional surrogate models may be found in U.S. Pat. No. 4,759,636, U.S. Patent Application Publication Nos. 2006/0160137 and 2007/0094187, and International Publication Nos. WO2007/018860, WO2007/018862, and WO2007/018858, the complete disclosures of which are hereby incorporated by reference herein.

A challenge of surrogate modeling is that surrogate models conventionally may be limited in their usefulness because they are limited to a single response at a single reference time. Specifically, such surrogates represent the current knowledge and computational capability at the time they were created and their responses are particular to the point in time for which they are generated. This time-specific nature of conventional surrogate models may result in a loss of accuracy and information compared to the full-physics model from which the surrogate model was generated, such as if an attempt is made to generalize the model for use in other applications and/or at other times. These limitations may be particularly apparent when the surrogates are designed for use to model subterranean regions that exhibit complex spatial and temporal behavior. In addition, computational capabilities and knowledge of the physics involved in a particular surrogate may quickly become outdated as available modeling capabilities and knowledge evolve. Re-running previous computer models and creating new surrogates, replacing previous surrogate models outright, or having contradictory surrogates can pose challenges.

SUMMARY OF THE DISCLOSURE

The present disclosure is directed to space-time surrogate models of subterranean regions and provides methods for creating and using the same. In some embodiments, the space-time surrogate models are created from implicit full-physics models of the subterranean, or subsurface, region. In some embodiments, the space-time surrogate methods are parametric with respect to two or more predetermined variables and also reflect responsiveness of these variables with respect to time. In some embodiments, the preselected variables include two or more space, state, and/or design variables. In some embodiments, the space-time surrogate models are parametric with respect to the preselected variables and to time. Methods of using and updating the space-time surrogate models are also disclosed.

BRIEF DESCRIPTION OF THE DRAWINGS

FIG. 5 is a flow chart of illustrative, non-exclusive methods for generating space-time surrogate models according to the present disclosure.

FIG. 6 is a flow chart of illustrative, non-exclusive methods for generating surrogate models of a subsurface region for selected time values.

FIG. 7 is a flow chart of illustrative, non-exclusive methods for creating a space-time surrogate model from the generated surrogate models for the subsurface region.

DETAILED DESCRIPTION AND BEST MODE OF THE DISCLOSURE

The present disclosure is directed to methods for generating and/or utilizing surrogate models for subsurface analysis. The subsurface analysis typically will relate to a subsurface region that includes one or more formations, which often may include a hydrocarbon reservoir.

As used herein, "subsurface" refers to beneath the top surface of any mass of land at any elevation or over a range of elevations, whether above, below, or at sea level, and/or beneath the floor surface of any mass of water, whether above, below, or at sea level. Accordingly, "subsurface" may refer to geologic strata occurring below the earth's surface.

As used herein, "formation" means a subsurface region, regardless of size, comprising an aggregation of subsurface sedimentary, metamorphic, and/or igneous matter, whether consolidated or unconsolidated, and other subsurface matter, whether in a solid, semi-solid, liquid, and/or gaseous state, related to the geological development of the subsurface region. A formation may contain numerous geologic strata of different ages, textures, and mineralogic compositions. A formation can refer to a single set of related geologic strata of specific rock type, or to a whole set of geologic strata of different rock types that contribute to or are encountered in, for example, without limitation, (i) the creation, generation, and/or entrapment of hydrocarbons or minerals and (ii) the execution of processes used to extract hydrocarbons or minerals from the subsurface.

As used herein, "surrogate model" refers to a mathematical model that seeks to predict, such as by interpolating or extrapolating a response, or output, based on output values previously acquired from empirical observation and/or mathematical calculations, including calculations using an existing full-physics model. Surrogate models additionally or alternatively may be referred to as surrogates, surrogate representations, surrogate response models, surrogate modeling systems, surrogate functions, response surface models, meta-models, and/or emulators.

Figure 1:
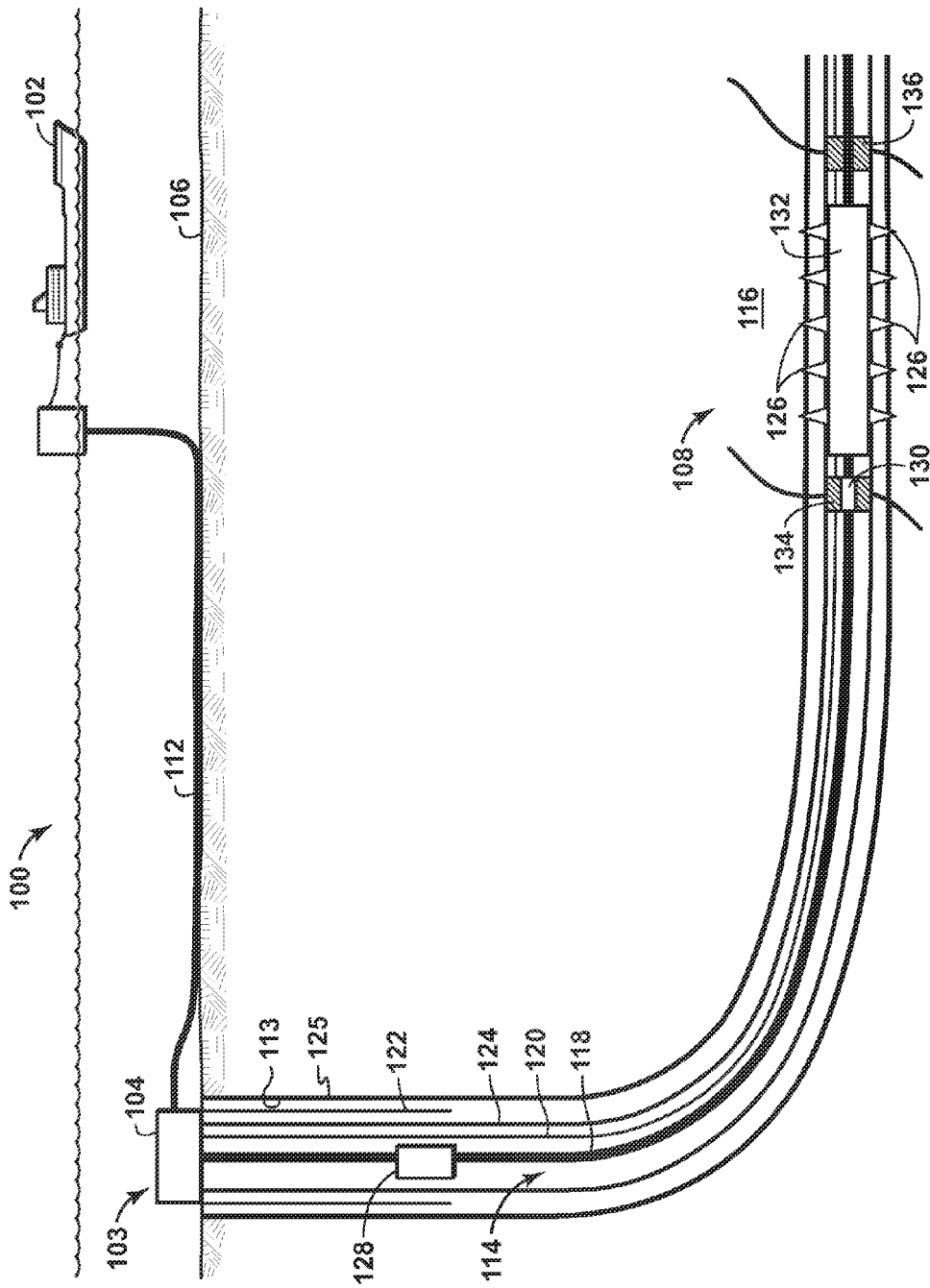
FIG. 1 is an illustrative hydrocarbon production system provided for background information. The production system includes a well.

By way of background and to provide an illustrative, non-exclusive example of a subsurface region, a subsurface region 100 and an associated production system 101 is illustrated in FIG. 1. It should be noted that FIG. 1 and the other figures of the present disclosure are intended to present illustrative, but non-exclusive, examples according to the present disclosure and are not intended to limit the scope of the present disclosure. The figures may not be drawn to scale, as they have been presented to emphasize and illustrate various aspects of the present disclosure. In the figures, the same reference numerals designate like and corresponding, but not necessarily identical, elements through the various drawing figures.

In production system 101, a floating production facility 102 is coupled to a well 103 having a subsea tree 104 located on the sea floor 106. To access subsea tree 104, a control umbilical 112 may provide a fluid flow path between subsea tree 104 and floating production facility 102 along with a control cable (not shown) for communicating with various devices within well 103. Through subsea tree 104, floating production facility 102 accesses a subsurface formation 108 that includes hydrocarbons, such as oil and gas. Offshore production system 101 is illustrated for illustrative, non-exclusive purposes, and the present surrogate models and methods for creating and/or using the same according to the present disclosure may be used in connection with the injection, extraction, and/or production of fluids and/or the analysis of reservoirs or other formations at any subsurface location.

To access subsurface formation 108, well 103 penetrates sea floor 106 to form a wellbore 113 bounding a well annulus 114 that extends to and through at least a portion of subsurface formation 108. Subsurface formation 108 may include various layers of rock that may or may not include hydrocarbons and may be referred to as zones. In this example, subsurface formation 108 includes a production zone, or interval, 116. This production zone 116 may include fluids, such as water, oil, and/or gas. Subsea tree 104, which is positioned over well annulus 114 at sea floor 106, provides an interface between devices within well annulus 114 and floating production facility 102. Accordingly, subsea tree 104 may be coupled to a production tubing string 118 to provide fluid flow paths and a control cable 120 to provide communication paths, which may interface with control umbilical 112 at subsea tree 104.

Well annulus 114 also may include various casings, or casing strings, 122 and 124 to provide support and stability for access to subsurface formation 108. For example, a surface casing string 122 may be installed from sea floor 106 to a location beneath sea floor 106. Within surface casing string 122, an intermediate or production casing string 124 may be utilized to provide support for walls of well annulus 114. Production casing string 124 may extend down to a depth near or through subsurface formation 108. If production casing string 124 extends to production zone 116, then perforations 126 may be created through production casing string 124 to allow fluids to flow into well annulus 114. Further, surface and production casing strings 122 and 124 may be cemented into a fixed position by a cement sheath or lining 125 within well annulus 114 to provide stability for well 103 and to isolate subsurface formation 108.

To produce hydrocarbons from production zone 116, various devices may be utilized to provide flow control and isolation between different portions of well annulus 114. For instance, a subsurface safety valve 128 may be utilized to block the flow of fluids from production tubing string 118 in the event of rupture or break in control cable 120 or control umbilical 112 above subsurface safety valve 128. Further, a flow control valve 130 may be utilized and may be or include a valve that regulates the flow of fluid through well annulus 114 at specific locations. Also, a tool 132 may include a sand screen, flow control valve, gravel packed tool, or other similar well completion device that is utilized to manage the flow of fluids from production zone 116 through perforations 126. Packers 134 and 136 may be utilized to isolate specific zones, such as production zone 116, within well annulus 114.

The various phases of well development are typically performed as serial operations that utilize specialized computational models to provide specific information about well 103. In some instances, these models are simplified by making general assumptions about certain aspects of well performance and reliability; however, this may result in errors that may impact field economics, performance, and/or efficiency. Full-physics, or full-field, implicit simulation models may be employed to account for the parameters that affect the subsurface region(s) and/or formation(s) being modeled, such as well performance or formation injectivity. However, and as discussed, such fine-scale full-physics models are complex, are time-consuming to implement, and are computationally intensive.

As illustrative examples, the full-physics models may be created through such illustrative implicit methods as finite element methods, finite volume methods, finite space methods, computational fluid dynamics methods, and/or related grid-based discretization methods. Further, new models must generally be developed for each particular well, near-wellbore, or other subsurface region of interest. Because these complicated models are directed to a specific application, it is not economically practical to conduct different studies to utilize these models for other applications, such as to optimize the completion design and/or ensure that all of the wells in a field are producing at full capacity despite the fact that a field includes numerous wells that produce hydrocarbons on a daily basis. Likewise, it is not practical to utilize the complicated full-physics simulation models to prevent well failures for each well or to analyze injectivity relative to each injection well. In addition, due to the above-discussed constraints of full-physics models, it is not practical to utilize the complicated full-physics models during each phase of the development of a well despite the accuracy and usefulness of the outputs of the full-physics models.

Conventionally, surrogate models have been used to provide explicit mathematical functions that emulate, or mimic, the responses of one or more implicit full-physics (fine-scale) models. As discussed, a surrogate model is a set of equations or algorithms created from data associated with one or more full-physics models. Surrogate models provide explicit functions, or solutions, that correlate to the implicit solutions generated by the full-physics model from which the surrogate model was generated. This enables surrogate models to provide highly accurate approximations of the outputs generated by a corresponding complex full-physics model. As such, surrogate models may be referred to as explicit models, whereas full-physics models may be referred to as implicit models. By "implicit," it is meant that these models are based on formulas and/or relationships in which dependent variables are not clearly, or explicitly, defined in terms of an independent variable. Thus, for a specific value of an independent variable, the value of the corresponding dependent variable is not immediately determinable. Instead, time-consuming, typically computationally intensive, iterative operations/solutions must be performed to accurately determine the value of the corresponding dependent variable.

As discussed herein, surrogate models enable users to predict the responses of the full-physics model without requiring the time, computational resources, and/or training that otherwise may be required to determine such a response from the full-physics model itself. An illustrative, non-exclusive example of such users include in-field (front-end) technicians, engineers, and other operators in the field, as opposed to in a research facility, such as in which the full-physics model may be created. For example, by being able to use a surrogate model to fairly quickly predict responses associated with the subsurface region that was modeled by the full-physics model, an operator may predict future performance, evaluate potential changes in design and/or state variables, and the like. This is schematically illustrated in FIG. 2, in which a subsurface region is indicated at 140, a full-physics model of the subsurface region is indicated at 142, a surrogate model of the subsurface region is indicated at 144, and an operator-created application of the surrogate model is indicated at 146.

Figure 2:
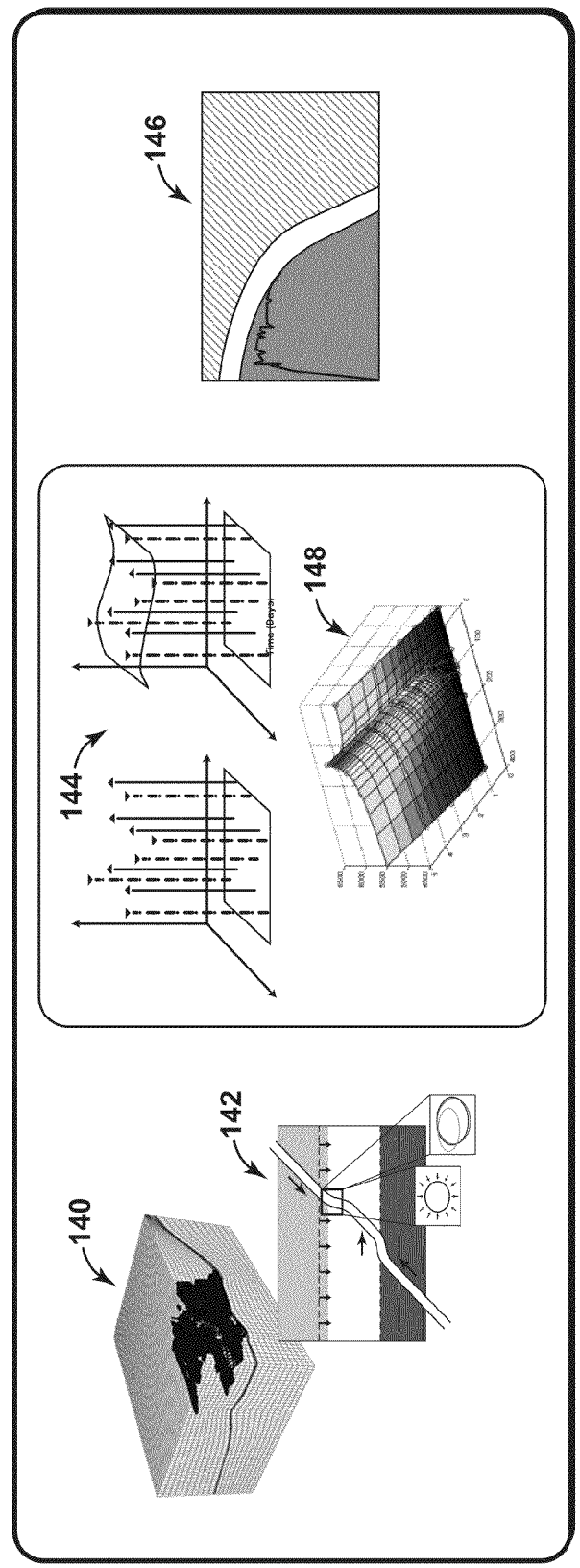
FIG. 2 is a schematic illustration of an actual subsurface region and computational models thereof.

In FIG. 2, surrogate model 144 represents an illustrative, non-exclusive example of a conventional surrogate model, and surrogate model 148 represents an illustrative, non-exclusive example of a space-time surrogate model, such as created, described, and/or utilized according to the present disclosure. As schematically illustrated in FIG. 2, the subsurface region is modeled by the full-physics model 142, from which the surrogate models 144 and 148 may be generated. These models may be used, such as in applications 146, to evaluate and/or predict the responsiveness of subsurface region 140 to changes in one more parameters, which may include changes in design, space, and/or state variables.

As also discussed herein, conventional surrogate models are limited to a response at a single reference time point, or time value, in an otherwise large domain, such as which may exhibit a highly complex spatial and temporal behavior. For example, some conventional surrogate models may be parametric with respect to one or more design variables but are specific to a particular space, time, and state variable value. Other conventional surrogate models may be parametric to one or more selected state and design variables but are still specific to a particular space and time variable value. Illustrative functions, or functional relationships, for these conventional surrogate models 144 are depicted at 150 and 152 in FIG. 3, and at 153, an illustrative mathematical function for a time-specific conventional surrogate model is indicated.

Figure 3:
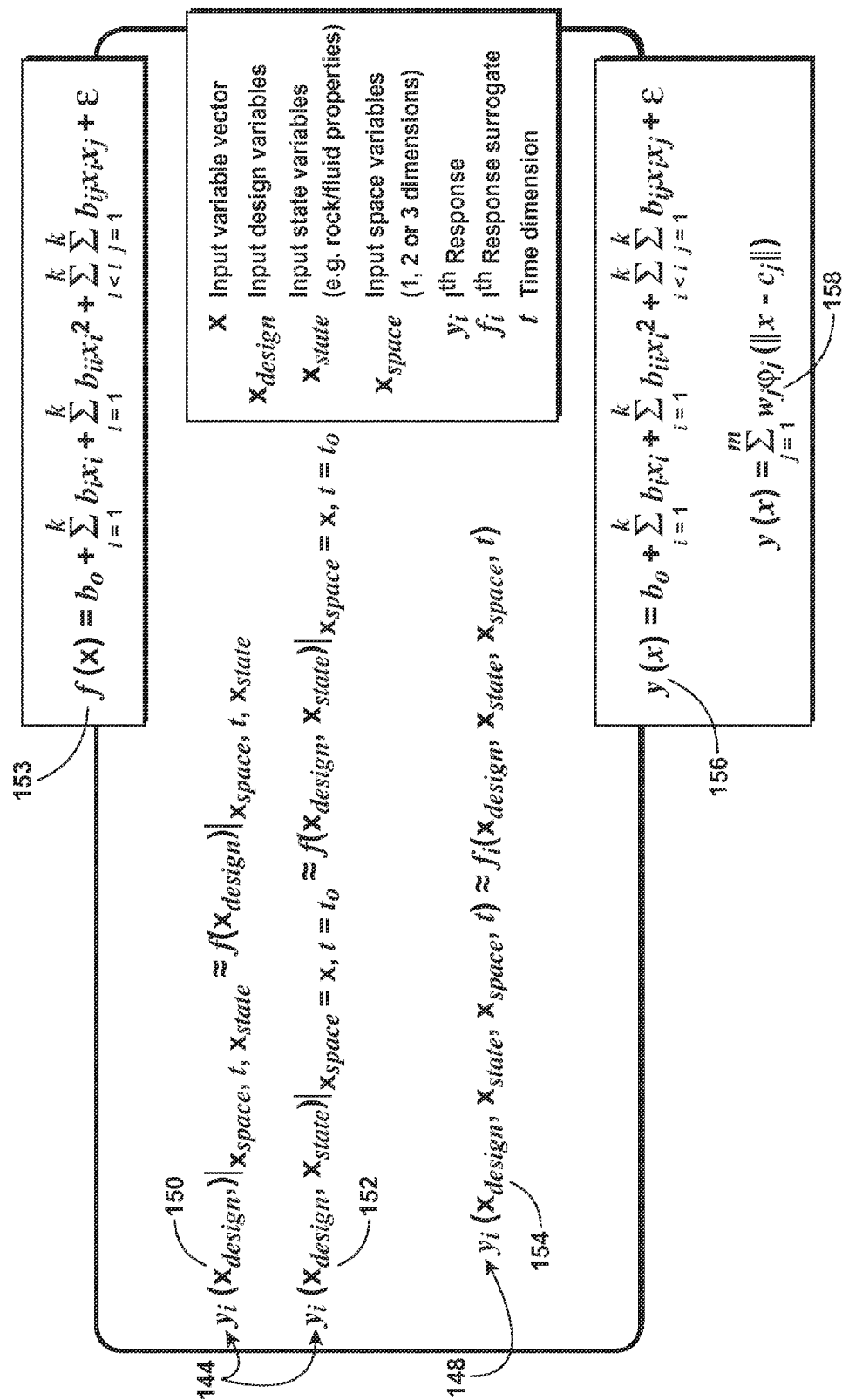
FIG. 3 is a diagram illustrating expressions for surrogate models, including space-time surrogate models according to the present disclosure.
Figure 4:
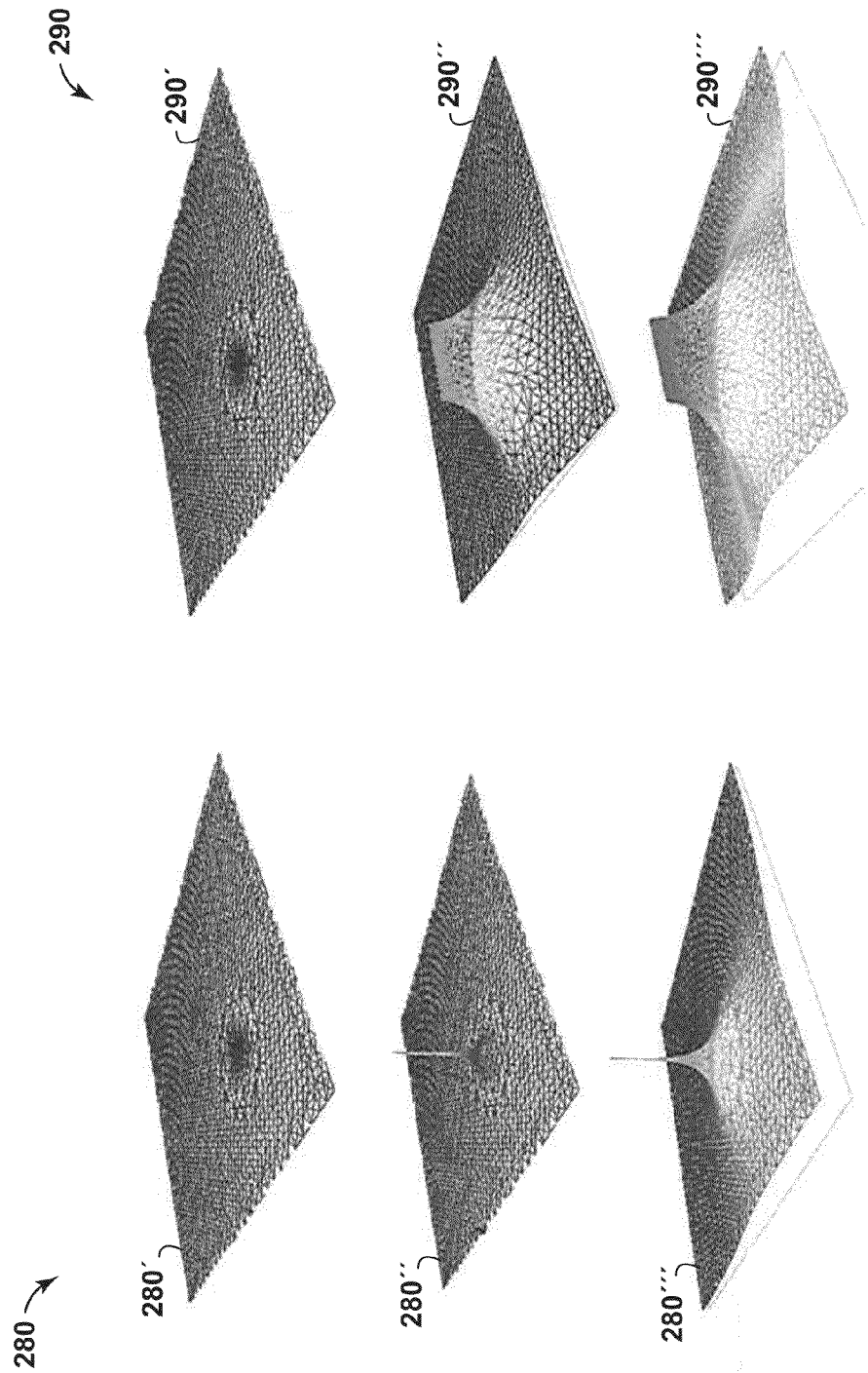
FIG. 4 depicts graphs showing pressure in subsurface regions containing a vertical well and a fractured vertical well at three different time values.

Both of the conventional surrogate models represented in FIG. 3 have utility, but they still suffer from limitations due to being specific to a particular time. Thus, when the values, or outputs, of the modeled parameters, or variables, vary with respect to time, the conventional surrogate models for one time value are often not able to be used to predict the behavior, or values, of the selected variable at other time values. FIG. 4 provides graphical examples of how such a variable, namely, pressure, may vary with time in a subsurface region. At 280, the pressure (or pressure field) in a subsurface region containing a vertical injection well is depicted, and at 290, the pressure in a subsurface region containing a fractured vertical well is depicted. In both examples, pressure is represented in the z-direction, with the subsurface region being depicted in terms of an x-y coordinate system. In both examples, water was injected into the wells at 1,000 barrels per day in the corresponding subsurface formation. FIG. 4 demonstrates the differences in pressure at time values of 0 (no injection), 8 hours, and 48 hours. These time-specific pressure fields are represented, respectively, at 280', 280", and 280''' for the vertical well, and 290', 290", and 290''' for the fractured well. In both examples, it can be seen that the pressure gradient is initially very steep and then relaxes, or lessens, toward a steady value. This transient behavior is difficult to model, or predict, with a conventional surrogate model.

In contrast to the time limitations of conventional surrogate models, the present disclosure is directed to methods for creating and/or using surrogate models that are parametric with respect to design, space, and state variables while also being parametric to, or otherwise reflecting, response variation over time. As such, these surrogate models are not limited to a particular time and therefore may provide greater utility than conventional surrogate models. These surrogate models may be referred to herein as space-time surrogates, such as indicated in FIG. 3 at 148. An illustrative, non-exclusive example of a function, or functional relationship, for a space-time surrogate 148 is depicted in FIG. 3 at 154. As also indicated in FIG. 3, the space-time surrogate may be expressed in terms of one or more regressive and/or interpolative functions 156 and 158.

As indicated in FIG. 3, the space-time surrogate function reflects one or more of state, space, and design variables. Space variables indicate the dimensionality of the surrogate model, namely, whether it is providing a solution in one, two, or three dimensions. Illustrative, non-exclusive examples of state variables include pressure, temperature, porosity, modulus of elasticity, shear modulus, viscosity, and the like. Illustrative, non-exclusive examples of design variables include the size and/or depth of the well, rate of fluid injection/ extraction, wellbore, or other formation being modeled, the type and/or rate of fluid movement in the subsurface region, the material from which the well or other man-made structures are formed, and the like.

FIG. 5 is a flow chart depicting illustrative, non-exclusive examples of methods for creating space-time surrogate models according to the present disclosure. As indicated at 160, the methods may include generating an explicit surrogate model of a subsurface region for one or more variables at a time value. As discussed, these variables may include one or more space, design, and/or state variables. The time value may be referred to as a first time value when the first of a series of related surrogate models are generated to create a space-time surrogate model for a subsurface region. The responses, or response values, for the surrogate model may be obtained by iterative solutions of the implicit (i.e., fine-scale full-physics) model of the subsurface region. The surrogate model may be constructed by using any suitable method, including using one or more of a polynomial fitting method, a nested surrogates technique, Kriging methods, Shepherd's methods, radial basis function (RBF) calculations, a neural network method, a cubic spline method, an n-dimensional tessellation method, etc.

A polynomial fitting method generally means using polynomial equations to fit experimental results. A nested surrogates technique generally means that curve fitting is applied using a fitting function, such as:

$$f(x)=a+b \cdot x+c \cdot x^2,$$

in which the terms a, b, and c are not simply fitting constants, but rather functions themselves of another variable, y, "nested" within the main fitting function. These fitting functions may have such forms such as:

$$a(y)=a_0+a_1 \cdot y+a_2 \cdot y^2,$$

and the terms $a_0$, $a_1$, $a_2$ also may be fitting functions of a third variable. This process may extend to as many variables as are necessary to properly characterize, or represent, the physics of the problem at hand. Variables from higher level functions also may be carried into the nested functions to further increase flexibility in curve fitting. For example, instead of the first nested function, a, being only a function of y, it also may be a function of x as follows:

$$a(x,y)=a_0+a_1 \cdot y+a_2 \cdot y^2+a_3 \cdot x+a_4 \cdot x^2+a_5 \cdot x \cdot y.$$

The fitting functions are not limited to the polynomial forms shown above, but may take on other functional forms as well without departing from the scope of the present disclosure. For example, polynomials may exhibit physically unrealistic behavior at extreme values of input parameters, especially if these inputs are outside a range of values determined using a design of experiments method. Additionally or alternatively, specific functional forms may be selected to mimic, or characterize, the physical parameters, or variables, of interest in a subsurface region.

An illustrative, non-exclusive example of surrogate modeling is response surface methodolology. Response surface methodolology, or "RSM," is a systematic approach for minimizing the number of simulation runs needed to meet desired objectives. Response surface methodology involves constructing a surrogate model based on the simulated responses of a computer-driven simulator to a limited number of intelligently chosen data points. When a solution is desired based on a particular set of data points, the solution may be acquired by using the surrogate model to interpolate from previous results rather than by re-running the full-physics model. Thus, RSM provides an estimated solution to a problem based upon past experiences without having to run a model for every new or "what-if" scenario. Response surface methodology is described in connection with International Patent Publication Nos. WO2007/018860 and WO2007/018862, each of which was published on Feb. 15, 2007. Each of these applications is entitled "Well Modeling Associated with Extraction of Hydrocarbons from Subsurface Formations." The disclosures of these applications are incorporated herein by reference.

As indicated in FIG. 6, generating 160 may include, but is not required in all methods according to the present disclosure to include, such steps, or actions, as selecting one or more variables to be modeled in the surrogate model. This is indicated in FIG. 6 at 162. In some methods, at least two such variables are selected. These variables may be referred to herein as preselected variables. As indicated at 164, for each of the preselected variables, at least one value is selected, and it is within the scope of the present disclosure that a plurality of values and/or a range of values may be selected for at least one, a subset, or even all, of the preselected variables. A time value for which the surrogate model response is to be evaluated is selected, as indicated at 166. As indicated at 167, a response, or response surface, is generated using the implicit model of the subsurface region, which as discussed may be a full-physics model. The surrogate model response additionally or alternatively may be referred to as a surrogate model output, or surrogate output. From the responses for the various variable values, at least one mathematical function, or equation, for the surrogate model may be determined, as indicated at 168. The function(s) may include surrogate function coefficients, with the function(s) being particular to the values of the preselected variables at the time value for which the surrogate model was created. As indicated at 169 in FIG. 6, generating 160 may include displaying one or both of the generated surrogate output and/or the determined surrogate function, or expression. As used herein, references to a (space-time or conventional) surrogate function may refer to one or more mathematical functions or equations.

As indicated in dashed lines in FIG. 5 at 170, methods according to the present disclosure optionally may include selecting an implicit model of a subsurface region to be utilized or even generating the implicit model of the subsurface region for which the space-time surrogate model is to be created. As discussed, this implicit model may be a full-physics model, such as a fine element model, finite volume model, finite space model, computational fluid dynamics model, and the like.

As also indicated in FIG. 5, the methods may further include, as indicated at 180, repeating the generating 160. For example, the generating may be repeated using a time value that differs from the initial, or first, time value. This repeating may occur a plurality of times, such as with different time values. It is within the scope of the present disclosure that the time values may define a range of time values and that the repeating may be repeated "n" times, with n being an integer that is greater than 1. Additionally or alternatively, the generating may be repeated using one or more different variables from the preselected variables and/or using a different value or range of values for at least one of the preselected variables. For each of the generating steps, a surrogate model may be created that is specific to the time value for which the response was generated from the implicit model.

At 190, a space-time surrogate model of the subsurface region is created. The space-time surrogate model may be parametric with respect to one or more, a subset, or even all of the preselected variables and also may indicate responsiveness of the model with respect to time or even be parametric with respect to time. Accordingly, the outputs, or responses, of individual surrogate models generated at 160 may be generalized, or otherwise integrated, to provide the space-time surrogate model that provides this responsiveness as to time that was not provided by the individual surrogate models. As an illustrative, non-exclusive example, and as indicated in FIG. 7 at 192, the generation of the surrogate models discussed at 160 in FIG. 5 may include generating a matrix of surrogate function coefficients for a plurality, if not all, of the surrogate models. This matrix may be referred to as an n-dimensional matrix, such as depending upon the preselected variables for which the surrogate models were created. At 194, the surrogate function coefficients may be parameterized with respect to time.

As an illustrative, non-exclusive example, a series of hierarchical interpolation algorithms may be utilized to determine how the coefficients vary with respect to at least a subset of the range of time values for which the surrogate models were generated. This process may include iterations that consider, or include, subsets of the surrogate model coefficients, such as which may relate to a particular range of values, preselected variable, subset of time values, and the like. This parameterization process may generate at least one function for the space-time surrogate model, with the function(s) having a series of space-time surrogate function coefficients. Depending on the subsurface region and/or full-physics model from which the space-time surrogate model is generated, the function(s) for the space-time surrogate model may include numerous coefficients. It is within the scope of the present disclosure (although not required for all space-time surrogate functions within this scope) that the functions may include such illustrative, non-exclusive examples of at least 15, 25, 50, 75, 100 or more coefficients. At 196, FIG. 7 indicates that these coefficients optionally may be stored, such as in a database containing space-time surrogate function coefficients from other solutions, or preselected variables and/or ranges of values, for the subsurface region. At 198 in FIGS. 5 and 7, the space-time surrogate function and/or the surrogate function coefficients optionally may be displayed.

As indicated in FIG. 5 at 200, the methods may, but are not required to, include validating the space-time surrogate model. Validating of the created space-time surrogate model may include utilizing any suitable methods and/or variable values to investigate, and ideally to confirm, that the space-time surrogate model accurately predicts the responses of the complex full-physics or other model and/or the real-world (actual) performance of the subsurface region being modeled. Any suitable method may be used to select values or ranges of values to be used to validate the space-time surrogate model. As an example, these values may be used to generate responses with the implicit model and the space-time surrogate model, with the responses then being compared. When selected and/or utilized to validate the space-time surrogate model, these values may be referred to as validation values, such as a validation value for one or more of the preselected variables and/or a validation time value. Additionally or alternatively, data obtained from the actual subsurface region being modeled may be obtained and compared to corresponding responses from the space-time surrogate model during this validation process. As indicated in FIG. 5 at 202, the methods may, but are not required to, include updating the space-time surrogate model, such as responsive to validating 200, additional empirical data, additional surrogate models, etc.

In the preceding discussion of the methods depicted in FIGS. 5-7, several references are made to displaying all or a portion of the conventional or space-time surrogate function output, response, and/or coefficients or expressions thereof. As used herein, "displaying" may include the direct act of causing display, and/or an indirect act that facilitates a direct act of displaying. Indirect acts include providing software to an end user, maintain a website through which a user is enabled to affect a display, hyperlinking to such a website, and/or cooperating or partnering with an entity or device that performs such direct or indirect acts. The displaying may include textual and/or graphic displays, such as which may be presented, or displayed, on a display device. A display device may include any suitable device for displaying the reference output, with illustrative, non-exclusive examples including a monitor (CRT, LCD, plasma, etc.), a flat panel device, a hand-held computing device, and a printer.

Any suitable method may be utilized for selecting the time value(s) and/or a desired range of values for any of the variables discussed herein. An illustrative, non-exclusive example of a suitable method is using design of experiments methods, or methodologies, to select these values. "Design of experiments" refers to a technique for identifying sampling points for variables, such as input parameters or input values, to be used in constructing a surrogate model (and/or a space-time surrogate model). Illustrative, non-exclusive examples of design of experiments techniques include a classical system and a space-filling method. Full factorial design and partial factorial design are both "factorial" design of experiments techniques. A factorial experiment is one whose design consists of two or more independent variables, each of which has discrete possible values. The units of the experiment may take on all possible combinations of these values, or levels, across all such variables. Such experiments enable an analyst to study the effect of each variable on each response. If the number of experiments for a full factorial design is too high to be logistically feasible, a fractional or partial factorial design may be done. In this instance, some of the possible combinations are omitted. However, a large number of runs are still required for accuracy. Several types of classical design of experiments methods exist, including a full factorial method, a partial factorial method, a central-composite, and a Box-Behnken method.

As indicated in FIG. 5 at 210, after creation and/or validation, the space-time surrogate model may be used. The space-time surrogate model can then be used for making rapid calculations, including time-varying calculations, of the subsurface region. These calculations may include, for example, physical behavior occurring within the subsurface region, such as non-ideal property and behavior regime transitions and/or movement of dissimilar fluids within the subsurface region.

In practice, the function(s) and/or response surface for the space-time surrogate model may be stored in memory and made accessible through software or other computer-based user tools. The user tool provides the reservoir engineer or other analyst with access to the detailed physics modeled by the space-time surrogate functions without the analyst having to utilize the corresponding detailed full-physics model. Moreover, when the results of prior space-time surrogate model solutions are stored, such as in a database of the corresponding space-time surrogate function coefficients, the analyst may access previously performed simulations of the detailed, physics-based engineering model.

When a response prediction is desired, such as for a particular value or range of values for one or more of the preselected variables and/or time values, a user may access the existing database of space-time solutions, such as a database of coefficients from prior solutions, to identify a sub-set of solutions that are near, or close to, the desired solution. These prior solutions, or results, may then be used to predict the space-time behavior, or result, for the specific values in question, such as by using interpolation or regression functions. Illustrative, non-exclusive examples of interpolative functions include radial-basis functions, Kriging modeling, and Gaussian process modeling. Illustrative, non-exclusive examples of regression functions include linearized and other polynomials, logistic and/or transcendental functions, and more complicated non-linear functions.

Figure 8:
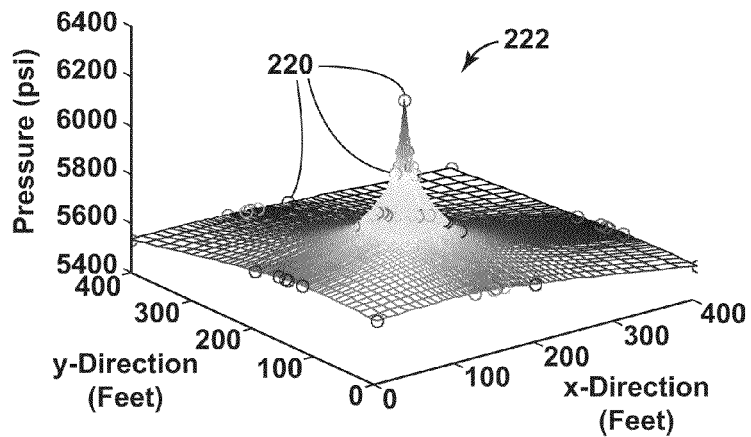
FIG. 8 is a graph illustrating pressure responses of a surrogate model and of a full-physics model at a time value in a subsurface region that includes a wellbore.

To illustrate a particular, but non-exclusive, example of methods according to the present disclosure to create a space-time surrogate model, consider an injector well in which the pressure around the well varies with time. With a defined injection rate at the well, and a defined outer boundary having a no-flow condition, the pressure was studied and a full-physics model was generated. The pressure was determined for a range of time values using the full-physics model. FIG. 8 graphically depicts this pressure distribution within the spatial subsurface region at an early time value, with the responses from the full-physics model indicated as fitting points, or circles, 220. At 222, a surrogate model of the pressure distribution is indicated, such as was created by fitting a radial-basis interpolation function to the responses from the full-physics model at the time value for which the responses were generated. As shown, the interpolation function accurately captures the physical behavior of the pressure field between the fitting points.

Figure 9:
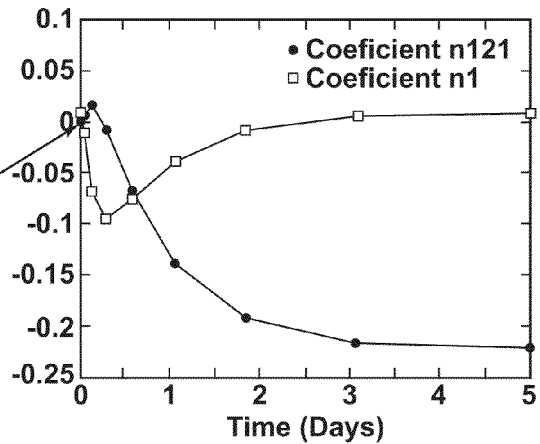
FIG. 9 is a graph depicting radial-basis interpolation function coefficients of the pressure within a range of time values.
Figure 10:
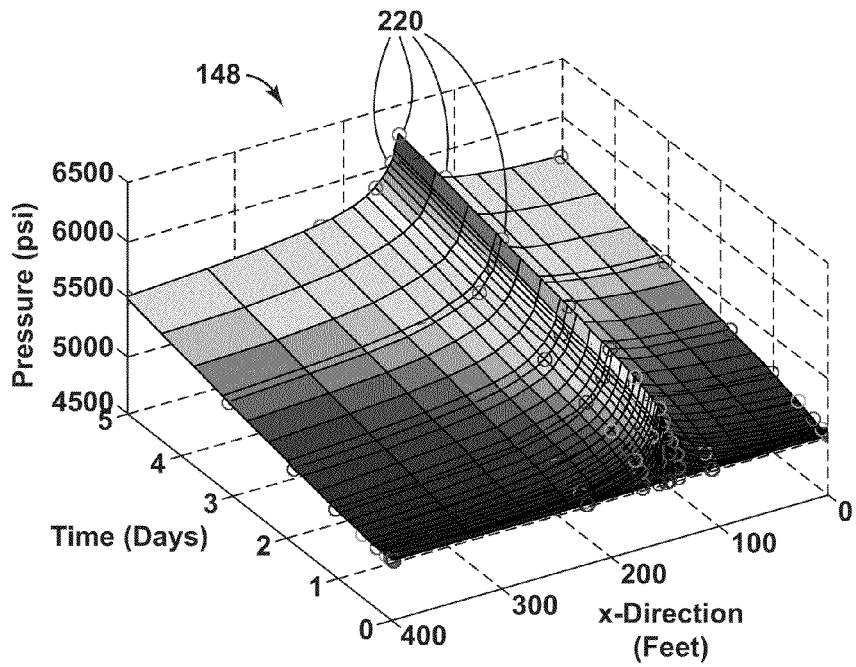
FIG. 10 is a graph illustrating pressure responses of a space-time surrogate model and of a full-physics model in the subsurface region of FIG. 7.

This process was repeated for a plurality, or range, of time values. The same interpolation function was then generalized to include the time domain, and an attempt was made to fit the interpolation function to the entire set of pressure field points from the start of the simulation to the end. This resulted in a substandard fit, as the function did not accurately correspond to the actual values. When the interpolation was fit individually to the pressure field time values, the coefficients followed a natural and smooth dynamic response. This is graphically illustrated in FIG. 9, in which two of the coefficients at each time value in a range of time values are plotted. A time-based interpolation function was then used to model the coefficients from the individual time-specific interpolation solutions. This time-based interpolation function for the coefficients was then embedded within the original pressure field function to create an accurate function for representing the space-time surrogate model 148 of pressure within the subsurface region, as shown in FIG. 10. In FIG. 10, fitting points from the full-physics model of the subsurface region are again indicated at 220.

Space-time surrogate models according to the present disclosure may be created and/or utilized for a wide variety of applications and uses. As illustrative, non-exclusive examples, space-time surrogate models may be generated and/or used to provide explicit responses, or outputs, for geotechnical and/or geomechanical analysis of a subsurface region, such as to evaluate and/or predict stresses and/or strains in a well or other subsurface region. This analysis may be used for such applications as to evaluate well reliability, well productivity, well injectivity, well stimulation, sand production, casing integrity, shear in formation, shear slip, well failure, well fatigue due to cycling straining, etc. Additional illustrative, non-exclusive examples of applications for using space-time surrogate models according to the present disclosure include to evaluate or otherwise predict movement of fluids, such as water and/or hydrocarbons, in a subsurface region and/or to determine the time-varying pressure gradient within a subsurface region. Further illustrative, non-exclusive examples include using space-time surrogate models of the pressure and/or fluid flow rate for such well architectures as hydraulically fractured wells, acid stimulated wells, deviated wells, and horizontal wells.

As a more specific, illustrative, non-exclusive example, consider a space-time surrogate model that is generated from a full-physics model to analyze well producibility in a subsurface region. In such an application, the preselected variables may include reservoir rock properties, reservoir fluid properties, in situ reservoir conditions, completion design, well design, and/or well operating conditions. As illustrative, non-exclusive particular examples, this analysis of well producibility may include analyzing and/or optimizing production conditions for maximizing recovery of completion efficiencies from one or more wells.

As another illustrative, non-exclusive example, a space-time surrogate model according to the present disclosure may be created and/or utilized for analyzing well operability. In such an application, preselected variables may include reservoir rock properties, reservoir fluid properties, in situ reservoir conditions, completion design, well design, and/or well operating conditions. This analysis of well operability may, but is not required to, include analyzing well operability limits, with a particular illustrative, non-exclusive example including evaluating the amount of mechanical stress that may be imposed upon the hardware in a well annulus before a failure is likely to occur.

As still a further illustrative, non-exclusive example, a space-time surrogate model according to the present disclosure may be created and/or utilized for analysis of well injectibility. In such an application, the input variables may include injection fluid properties, reservoir rock properties, reservoir fluid properties, in situ reservoir conditions, completion design, well design, and/or well operating conditions.

The space-time surrogate models according to the present disclosure may be utilized to produce and/or extract hydrocarbons from a subsurface region, such as a formation therewithin. For example, the space-time surrogate models may be utilized to predict, or evaluate, the behavior and/or the responses of the hydrocarbons or surrounding subsurface structures to changes in one or more preselected variables, including such changes over time. Hydrocarbons may then be extracted from the subsurface region based at least in part on the responses from the space-time surrogate models. This extraction, or production, of hydrocarbons from the subsurface region may include operating the well, and/or related structures, responsive at least in part to the outputs from the space-time surrogate models. In some applications, additional wells may even be drilled or otherwise created or modified based at least in part on the responses from the space-time surrogate models.

Figure 11:
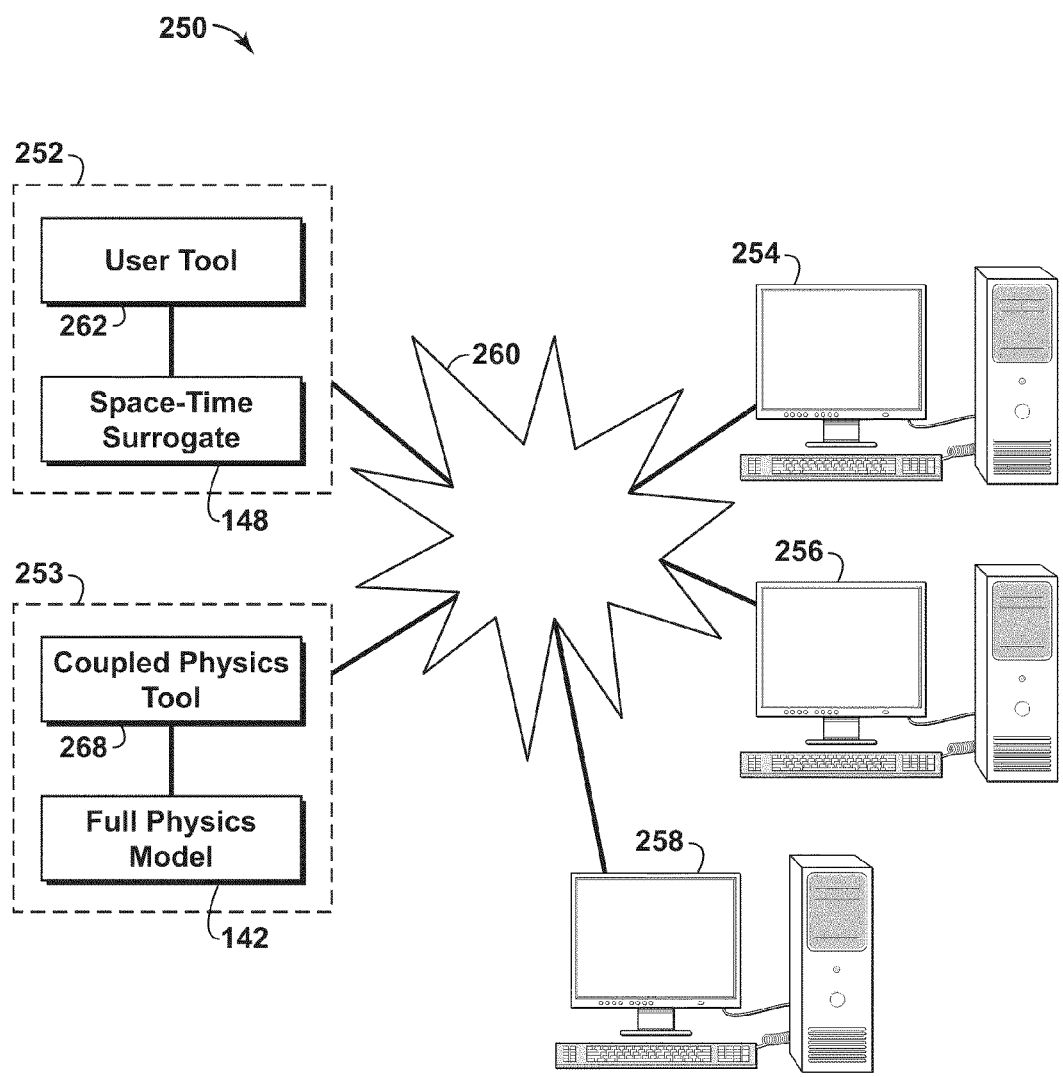
FIG. 11 is an illustrative, non-exclusive example of computer architecture that may be used with certain aspects of space-time surrogate models according to the present disclosure.

Space-time surrogate models according to the present disclosure may be created and/or utilized with a user tool. For example, a user tool may enable the space-time surrogate models to be utilized for efficient and accurate modeling of the subsurface region of interest, such as to evaluate, predict, optimize, characterize, and/or otherwise study or utilize the modeled subsurface region. An illustrative, non-exclusive example of a suitable user tool is schematically illustrated in FIG. 11. FIG. 11 schematically depicts a space-time surrogate modeling system 250 in accordance with certain aspects of the present disclosure. In this modeling system 250, a first device 252 and a second device 253 may be coupled to various client devices 254, 256, and 258 via a network 260. First device 252 and second device 253 may include a computer, a server, a database or other processor-based device, and the client devices 254, 256, 258 may include laptop computers, desktop computers, servers, or other processor-based devices. Each of these devices 252, 253, 254, 256, and 258 may include a monitor, keyboard, mouse, and/or other user interface components for interacting with the analyst, field technician, or other operator. Accordingly, such a monitor may be utilized for displaying the space-time surrogate model outputs according to the present disclosure.

Although not required to all embodiments, each of devices 252, 253, 254, 256, and 258 may be located in different geographic locations, such as different offices, buildings, cities, or countries. Accordingly, network 260 may include different devices (not shown), such as routers, switches, bridges, or cables for example. Also, network 260 may include one or more local area networks, wide area networks, server area networks, or metropolitan area networks, or combinations of these different types of networks. The connectivity and use of network 260 by devices 252, 253, 254, 256, and 258 operate through the internet, an intranet, or another suitable network communication system using either a wired or a wireless platform.

In a more basic arrangement, system 250 may be implemented without a network 260. In such an arrangement, first device 252 may be loaded onto the second device 253, with second device 253 residing in one or more of devices 254, 256, and 258. The user tool and methods disclosed herein are not limited by the architecture of the space-time surrogate modeling system 250 shown in FIG. 11, so long as the system has sufficient memory, operating speed, and user interface components to operate the appropriate software including a user tool 262.

As schematically illustrated in FIG. 11, first device 252 includes user tool 262. The user tool, which may reside in memory within first device 252, may be an application, for example. This application, which is further described below, may display or otherwise provide computer-based representations of a well, wellbore region, formation, or other subsurface formation or region. An illustrative, non-exclusive example of such a representation includes well 103 of FIG. 1, which as depicted in FIG. 1 is connected to a petroleum reservoir or a depositional basin, such as subsurface formation 108. User tool 262 may be implemented as a spreadsheet, program, routine, software package, or other suitable computer readable software instructions in an existing program, which may be written in a computer programming language, such as Visual Basic, Fortran, C++, Java and the like. The memory storing user tool 262 may be of any conventional type of computer readable storage device used for storing applications, which may include hard disk drives, floppy disks, CD-ROMs and other optical media, magnetic tape, and the like.

User tool 262 may be configured to interact with one or more space-time surrogate models 148, such as which may have been created in accordance with the present disclosure. As discussed, such space-time surrogate models may be utilized to effectively analyze such illustrative, non-exclusive criteria as well operability limits, well operability and productivity limits, and/or formation injectivity. In the arrangement of FIG. 11, user tool 262 is based on a common platform to enable analysts to evaluate technical limits at the same time, possibly even simultaneously. An analyst may use one of devices 254, 256, and 258 to operate user tool 262 and to obtain solutions based upon the space-time surrogate models. Further, user tool 262 may be configured to provide graphical outputs, or responses, such as which may permit the analysts to compare outputs from various values for the preselected parameters and/or time values. These graphical outputs may be provided in any suitable form, such as in the form of tables, graphics, and/or charts.

Second device 253 includes a coupled physics tool 268 that is configured to integrate various engineering models together. Coupled physics tool 268, which may reside in memory within second device 253, may be an application, for example. This application may provide space-time surrogate models relating to a subsurface region that includes a well, such as well 103 of FIG. 1. Coupled physics tool 268 may be implemented as a program, routine, software package, or additional computer readable software instructions in an existing program, which may be written in a computer programming language, such as Visual Basic, Fortran, C++, Java and the like. The memory storing coupled physics tool 268 may be of any conventional type of computer readable storage device used for storing applications, which may include hard disk drives, floppy disks, CD-ROMs and other optical media, magnetic tape, and the like.

Associated with coupled physics tool 268, are various engineering models, which may include full-physics models 142. As discussed, full-physics models may include and/or utilize computer-implemented computational engineering models or simulations based on either finite difference, 3D geomechanical finite-element, finite element, finite volume, or another point or grid/cell-based numerical discretization method used to solve partial differential equations. Similar to user tool 262, full-physics models 142 may be accessed by other devices, such as devices 254, 256, and 258, and may be configured to provide responses, such as which may be outputted, communicated to a user, stored, and/or displayed in accordance with the present disclosure.

A related challenge when generating and/or using full-physics, conventional surrogate, and space-time surrogate models of a subsurface region is managing the array, or collection, of models, including related functions, coefficients, displays, etc. This may be especially challenging when the models relate to the same or overlapping subsurface regions. For example, new models and/or updates of existing models may be created, generated, or otherwise developed, such as responsive to new information. Illustrative, non-exclusive examples of such new information that may result in the creation, generation, and/or updating of these models include (but are not limited to) the generation of more accurate models and/or modeling techniques, the development of new models relating to the subsurface region and/or a subsurface region that overlaps with a previously modeled subsurface region, obtaining additional data from the actual subsurface region and/or experiments, monitoring of the actual subsurface region, monitoring of usage of existing models, and/or monitoring of the performance and/or accuracy of existing models.

A further illustrative, non-exclusive source of new information relates to information relating to a change in the subsurface region being modeled. As illustrative, non-exclusive examples, man-made subsurface structures may change and/or be added, the types and/or quantities of fluids in the subsurface region may change, fractures and/or other faults may occur in formations in the subsurface region, etc. When such changes occur, the previously created models of the subsurface region may no longer accurately predict the responses occurring in the subsurface region. New models may be generated in view of the changes in the subsurface region. Additionally or alternatively, existing models may be updated, or "evolved," to incorporate the changed features of the previously modeled subsurface region. In the context of a full-physics model, this evolution may include an underlying mesh or grid to be updated to accommodate the varying geometry of subsurface features. During this mesh evolution process, parameter values which have been stored at nodes or element locations need to be mapped into the appropriate locations in the new mesh. As discussed, from the original or updated full-physics models, surrogate models, including space-time surrogate models, may be generated.

Figure 12:
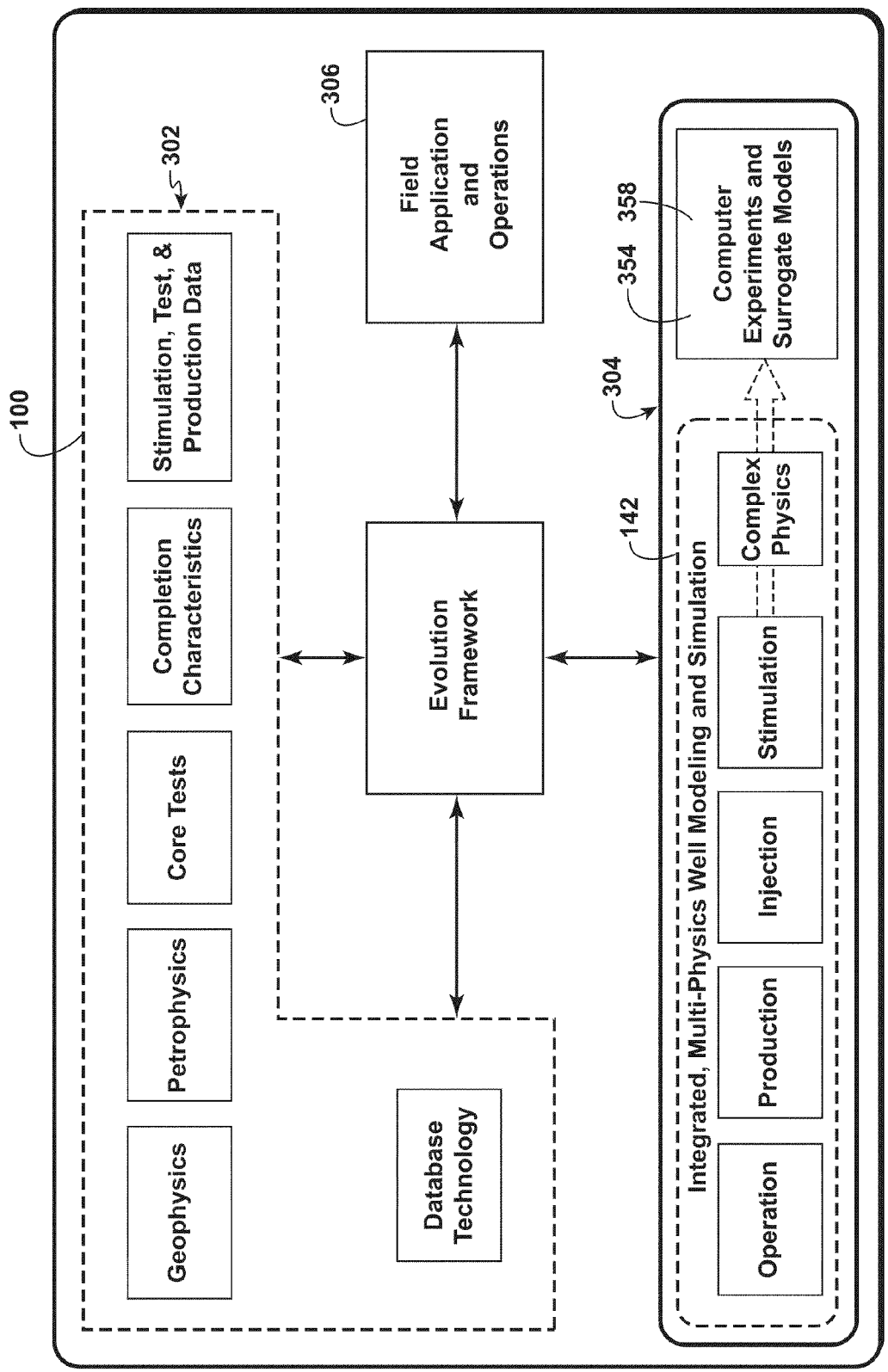
FIG. 12 is a schematic illustration depicting the relationship between subsurface regions, models of the subsurface region, and users.

However, simply replacing existing models with new or updated models has a potential for causing disruptions, interruptions, and/or errors. Similarly, having an extensive list of variations, or prior versions, of existing models also has such a potential for disruptions, interruptions, and/or errors. For example, a user may not be aware of a change in an existing model and/or may not be familiar with a new or updated model, different users may use different versions of the same models and/or different models of the same subsurface region, existing models may be temporarily unavailable while being updated, updating of a model to incorporate new information may affect other aspects of the model, etc. This relationship between the models, the subsurface region, and users is schematically illustrated in FIG. 12, in which a subsurface region is indicated generally at 302, models of the subsurface region are indicated generally at 304, and users and corresponding user tools and interfaces are indicated generally at 306. Subsurface region 302 may represent the actual subsurface region itself, such as region 100 discussed in connection with FIG. 1, elements of the subsurface region, and/or data obtained from the subsurface region. As indicated, the models may include full-physics models 142, conventional surrogate models 144, and/or space-time surrogate models 148.

Figure 13:
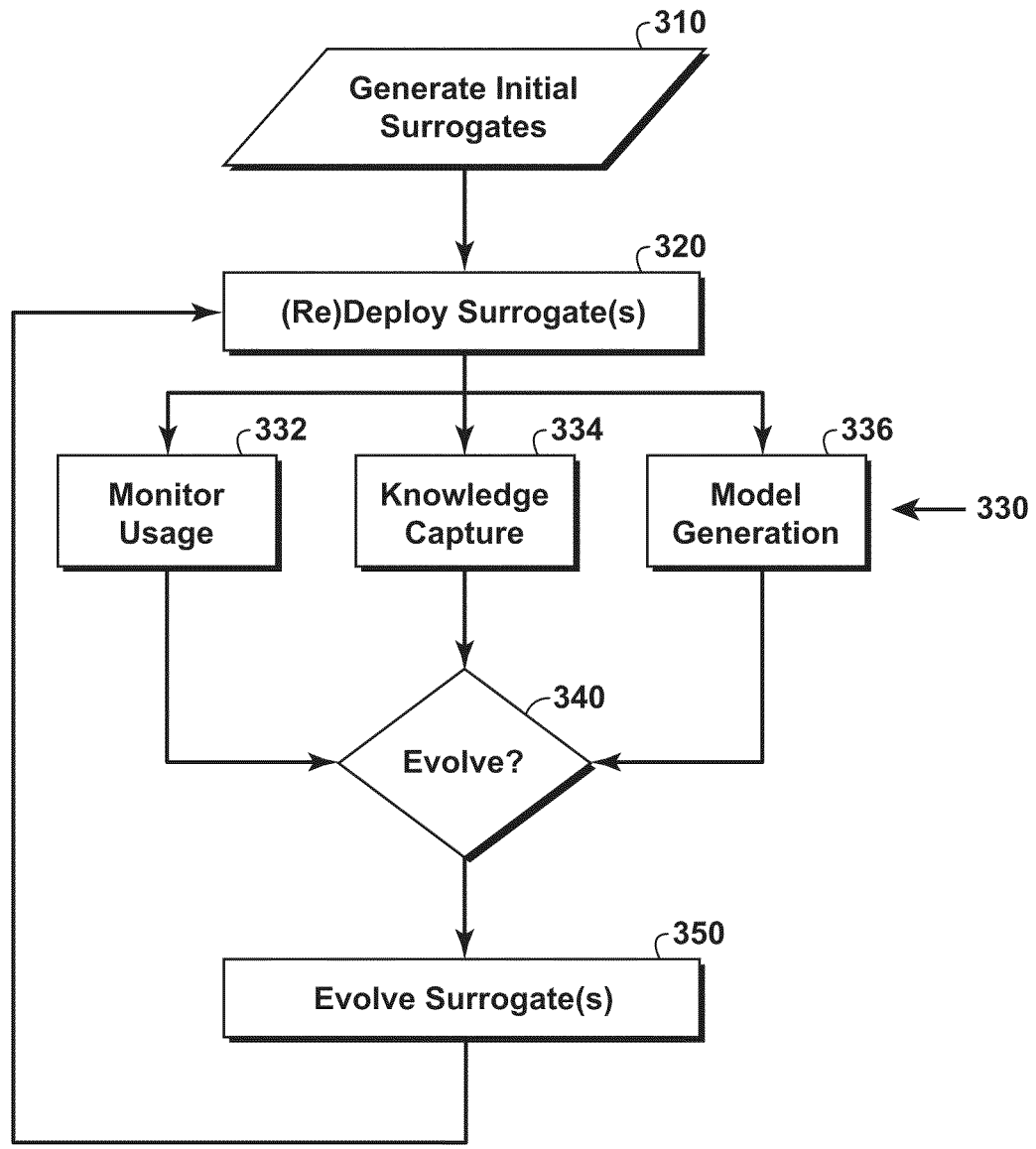
FIG. 13 is a flow chart illustrating illustrative, non-exclusive examples of methods for evolving a system of surrogate models according to the present disclosure.

FIG. 13 presents an illustrative, non-exclusive example of methods and/or techniques for incorporating new models when there are one or more existing models of the same, overlapping, or otherwise related subsurface region. In FIG. 13, the evolution process is described and illustrated with respect to surrogate models. It is within the scope of the present disclosure that this evolution process may be applied to other models, including full-physics models. Furthermore, it is within the scope of the present disclosure that the surrogate models illustrated and/or described with respect to FIG. 13 may be conventional surrogate models and/or space-time surrogate models, such as those described herein.

As indicated in FIG. 13 at 310, surrogate models are generated. As discussed, this creation process may include generating one or more surrogates from a corresponding full-physics or other implicit model. At 320, one or more of the created surrogate models are deployed to, or otherwise made available for use by, users. As discussed, these users may include in-field operators. At 330, new information is obtained. As discussed, this new information may include any information, models, data, and the like that may affect existing models, including updating of such models, and/or which may result in the generation of new models. Illustrative, non-exclusive examples of such new information 330 are indicated in FIG. 13. The new information may be considered individually, in groups, or collectively without departing from the scope of the present disclosure.

As indicated, at 332, 334, and 336, respectively, such new information may include monitoring of usage of existing models, knowledge capture, and generation of new models. Monitoring of usage of existing models may include such considerations as the frequency of use, the purpose of use, geographic application areas, application of risk/reward measures, design space activity with the modes, and/or the outputs from such use. Knowledge capture may include information obtained from such sources as the outputs of the existing models and/or data or other information from the subsurface region itself, from computerized experiments, from physical experiments, from tests, from studies, etc. Knowledge capture may additionally or alternatively also include the development or obtaining of new computational techniques, devices, software, modeling processes, and the like. Generation of new models may include the generation of one or more new full-physics model, conventional surrogate model, and/or space-time surrogate model.

As indicated at 340 in FIG. 13, responsive to such new information 330, such as responsive to consideration and/or analysis of such new information, a decision is made whether or not to update one or more of the existing models. This updating may include replacing the existing model, changing its function(s) or expressions, and where applicable, changing the corresponding surrogate function coefficients. Any suitable decision framework, or policy, may be utilized to determine whether or not to evolve, or otherwise change, one or more of the existing models, which as discussed, may be full-physics models, conventional (time-specific) surrogate models, or space-time surrogate models. This framework may, but is not required to, include such considerations as weighing factors for the new information, business goals, desired future applications of the models, accuracy of the existing models, value/utility of updating the model rather than continuing to use the existing model, etc.

When it is determined that an existing model should be updated, or evolved, this updating occurs and the updated model is made available for use. The updating is indicated at 340 and may include one or more of changing the existing model and replacing the existing model with a new model. It is further within the scope of the present disclosure that the updating may include replacing two or more existing models with a new model and/or replacing an existing model with two or more new models. The updates to existing models may include updates or new information relating to the function(s) or expressions for the surrogate models and/or the surrogate function coefficients. The updating may include application of, or use of, weighting factors to incorporate the new information into the existing model. In some applications, this may involve utilizing tools such as neural networks, genetic algorithms, and/or space-maps, where appropriate to weight and/or incorporate the new information with the existing model.

An illustrative, non-exclusive example of using surrogate evolution techniques according to the present disclosure is now described. In this example, an original surrogate was created to predict lateral bending of a tubular during well drawdown for competent rocks using advanced numerical models of rock-pipe interaction during production of hydrocarbons through a well. The design space was limited to the range of reservoir properties expected in the field, and the surrogate model was generated using design of experiments techniques to evaluate the design space. Over time, more of the wells were being operated in less competent rock as projects moved into shallower, more highly compressible formations. Thus, the original computer model sample points were not valid for the new rock type. Laboratory tests of the new rock determined that properties of the new rock were outside of the original range of consideration. Accordingly additional design of experiments runs were selected that covered the increased rock compressibility. The responses, or outputs, from these additional simulations demonstrated a non-linear trend of increasing tubing displacement for the same operating conditions. In view of this divergent trend, the original surrogate model was evolved. This evolution process included investigating the terms within the original surrogate equation that were making it invalid for the new rock type and generalizing them so that the original equation retained its original form but could accurately predict the behavior of the new rock.

In the present disclosure, several of the illustrative, non-exclusive examples of methods have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

It is also within the scope of the present disclosure that the above-discussed methods for creating and using space-time surrogate models may be applied, analogously, to space-time surrogate models that are created from a series, or plurality, of conventional surrogate models that are specific for a series of spaces, or points, but which are parametric with respect to time, or optionally time and state variables. For example, in such an application, from an implicit model of a subsurface region, an explicit surrogate model may be generated for (pre)selected variables that include at least one time and state variable at a specific space variable value. This process may be repeated 'n' times for a range, or series, of space variable values, and then an explicit space-time surrogate model of the subsurface region may be created from the series of explicit surrogate models. The space-time surrogate model may then be used, consistent with the above description of use and applications of the previously discussed explicit space-time surrogate models.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B", when used in conjunction with open-ended language such as "comprising" can refer, in one embodiment, to A only (optionally including entities, other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" may mean A alone, B alone, C alone, A and B together, A and C together, B and C together, A, B and C together, and optionally any of the above in combination with at least one other entity.

Illustrative, non-exclusive examples of systems and methods according to the present disclosure are presented in the following numbered paragraphs. It is within the scope of the present disclosure that the individual steps of the methods recited herein, including in the following numbered paragraphs, may additionally or alternatively be referred to as a "step for" performing the recited action.

1. A method for creating a space-time surrogate model of a subsurface region, the method comprising:
  generating an explicit surrogate model of an implicit model of a subsurface region for preselected variables at a first time value;
  repeating the generating n times for n additional time values that are different than the first time value, wherein n is an integer greater than 1, wherein the first time value and the n additional time values define a range of time values; and
  creating an explicit space-time surrogate model of the implicit model based on the surrogate models produced by the generating and the repeating, wherein the space-time surrogate model is parametric for at least the preselected variables and also indicates changes in the variables over at least the range of time values.

2. The method of paragraph 1, wherein the generating includes selecting a range of values for one or more of the preselected variables.

3. The method of any preceding paragraph, wherein the implicit model is a full-physics model of the subsurface region.

4. The method of any preceding paragraph, wherein the method further includes generating the implicit model of the subsurface region.

5. The method of any preceding paragraph, wherein the preselected variables include at least two variables selected from the group consisting of space, state, and design variables, and further wherein the generating includes defining a range of values for at least one of the preselected variables and producing an explicit surrogate model that includes responses for the range of values.

6. The method of paragraph 5, wherein the generating includes defining a range of values for all the preselected variables and producing an explicit surrogate model that includes responses for the range of values.

7. The method of paragraph 5 or 6, wherein the producing includes parameterizing the responses for the range of time values.

8. The method of any of paragraphs 5-7, wherein the producing includes creating an explicit space-time surrogate model using the responses for the range of values.

9. The method of any of paragraphs 1-5, wherein the creating includes creating a space-time surrogate model that is parametric with respect to the selected variables and to time.

10. The method of any preceding paragraph, wherein the generating includes determining surrogate function coefficients for the preselected variables at the time value and determining how the coefficients vary for different time values within the range of time values.

11. The method of any preceding paragraph, wherein the generating includes determining surrogate function coefficients for the preselected variables at each of the time values and creating includes producing an n-dimensional matrix of the surrogate function coefficients.

12. The method of any preceding paragraph, wherein the generating includes determining surrogate function coefficients for the preselected variables at each of the time values and parameterizing the surrogate function coefficients with respect to time to produce space-time surrogate function coefficients.

13. The method of paragraph 12, wherein the parameterizing includes using one or more hierarchical interpolation algorithms to generate the space-time surrogate function coefficients.

14. The method of paragraph 12 or 13, wherein the method further includes displaying at least one of the space-time surrogate function coefficients and the space-time surrogate model.

15. The method of any of paragraphs 12-14, wherein the method further includes storing at least one of the space-time surrogate function coefficients and the space-time surrogate model.

16. The method of any preceding paragraph, wherein the method includes validating the space-time surrogate model.

17. The method of paragraph 16, wherein the method includes validating the space-time surrogate model using the implicit model.

18. The method of paragraph 16 or 17, wherein the method includes validating the space-time surrogate model using data obtained from the subterranean region.

19. The method of any of paragraphs 16-18, wherein the method includes validating the space-time surrogate model using at least a first validation time value that is within the range of time values.

20. The method of any of paragraphs 16-19, wherein the method includes validating the space-time surrogate model using a plurality of different time values that are within the range of time values.

21. The method of any of paragraphs 16-20, wherein the method includes validating the space-time surrogate model using at least one validation value of the preselected variables.

22. The method of any preceding paragraph, wherein the method includes using a design of experiments method for at least one: determining the range of time values, determining a range of values for at least one of the preselected variables, and validating the space-time surrogate model.

23. The method of any preceding paragraph, wherein the method includes obtaining new information and determining whether or not to update the space-time surrogate model responsive to the new information.

24. The method of any preceding paragraph, wherein the method includes displaying the space-time surrogate model.

25. An explicit space-time surrogate model of the subsurface region created by the method of any preceding paragraph.

26. A method for extracting hydrocarbons from a subsurface region, the method comprising:
using a space-time surrogate model created by the method of any of paragraphs 1-24 to predict at least one of the presence of and the performance of hydrocarbons in the subsurface region; and
extracting the hydrocarbons from the subsurface region based at least in part on the prediction.

27. A method for using a space-time surrogate model of a subsurface region to predict subterranean physics, the method comprising:
selecting input values for which a predicted space-time response from a subsurface region is desired, wherein the input values include values for at least two preselected variables and a time value;
accessing a database of space-time surrogate function coefficients for a plurality of explicit space-time surrogate models of a full-physics model for at least the preselected variables and a time period in the subsurface region, wherein the space-time surrogate function coefficients correspond to parameterized solutions of the preselected variables for a range of time values within the time period;
identifying the closest solutions in the database to the input values; and
determining a response for the input values based on the closest solutions from the database of space-time surrogate function coefficients.

28. The method of paragraph 27, wherein the determining includes utilizing at least one interpolative or regressive function to determine the response based on the closest solutions.

29. The method of paragraph 28, wherein the determining includes utilizing at least one interpolative function selected from the group consisting of radial-basis, Kriging, and Gaussian functions.

30. The method of paragraph 28, wherein the determining includes utilizing at least one regressive function selected from the group consisting of linearized polynomial, logistic, and non-linear functions.

31. The method of any of paragraphs 27-30, wherein the determining includes determining a set of response space-time surrogate function coefficients for the input values.

32. The method of any of paragraphs 27-31, wherein the method further comprises at least one of storing the set of response space-time surrogate function coefficients in the database and displaying the set of response space-time surrogate function coefficients.

33. The method of any of paragraphs 27-32, wherein the method further includes creating the database of space-time surrogate function coefficients, and optionally creating the database of space-time surrogate function coefficients from an implicit model of the subsurface region.

34. The method of any of paragraphs 27-33, wherein the method includes displaying the response.

35. The method of paragraph 34, wherein the method includes graphically displaying the response.

36. The method of any of paragraphs 27-35, wherein the method includes obtaining new information and determining whether or not to update the space-time surrogate model responsive to the new information.

37. A method for extracting hydrocarbons from a subsurface region, the method comprising:
predicting a response using the method of any of paragraphs 27-36; and
extracting the hydrocarbons from the subsurface region based at least in part on the prediction.

38. A space-time surrogate modeling method for a subsurface region, the method comprising:
step for generating a time-specific surrogate model of a subsurface region for a plurality of values for two or more preselected variables;
repeating the step for generating to generate a plurality of time-specific surrogate models for a plurality of time values; and
step for generating a space-time surrogate model of the subsurface region based on the plurality of time-specific surrogate models.

39. The method of paragraph 38, wherein the method includes utilizing the space-time surrogate model to predict a response in the subsurface region.

40. The method of paragraph 39, wherein the method includes extracting hydrocarbons from the subsurface region based at least in part upon the predicted response.

INDUSTRIAL APPLICABILITY

The space-time surrogate models, and the methods of creating and/or utilizing the same, are applicable to the oil and gas industry.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method for causing a computer processor to assist with creating a space-time surrogate model of a subsurface region, the method comprising:
(a) providing non-transitory computer readable instructions to the computer processor to cause the computer processor to generate a surrogate model of a full-physics model of a subsurface region for preselected variables at a first time value within a range of time values within at least a portion of the full-physics model and determining a corresponding surrogate model coefficient for the first time value;
(b) repeating step (a) n times for n additional time values that are different than the first time value, wherein n is an integer greater than 1, wherein the first time value and the n additional time values define the range of time values and creates a matrix of surrogate model coefficients over the range of time values;

(c) generating a time-varying function related to at least a portion of the matrix of surrogate model coefficients; and (d) thereafter, creating an explicit space-time surrogate model of the at least a portion of the full physics model based on (1) the surrogate models produced by the generating and the repeating and (2) the generated at least one time-varying function, wherein the created explicit space-time surrogate model is parametric for at least the preselected variables and also indicates changes in the preselected variables over at least the range of time values.

2. The method of claim 1, wherein the generating includes selecting a range of values for one or more of the preselected variables.

3. The method of claim 1, wherein the preselected variables include at least two variables selected from a group consisting of space, state, and design variables, and further wherein the generating includes defining a range of values for at least one of the preselected variables and producing the surrogate model that includes responses for the range of 'n' values.

4. The method of claim 3, wherein the generating includes defining a range of values for all the preselected variables and producing the surrogate model that includes responses for the range of values.

5. The method of claim 1, wherein the created space-time surrogate model is parametric with respect to the preselected variables and to time.

6. The method of claim 1, wherein the generating includes determining surrogate function coefficients for the preselected variables at the n additional time values and determining how the coefficients vary for at least some of the n additional time values within the range of time values.

7. The method of claim 1, wherein the generating includes determining surrogate function coefficients for the preselected variables at each of the n additional time values, and wherein the creating includes producing an n-dimensional matrix of the surrogate function coefficients.

8. The method of claim 1, wherein the generating includes determining surrogate function coefficients for the preselected variables at each of the n additional time values and parameterizing the surrogate function coefficients with respect to time to produce space-time surrogate function coefficients.

9. The method of claim 8, wherein the method further includes displaying at least one of the explicit space-time surrogate function coefficients.

10. The method of claim 8, wherein the method further includes storing at least one of the explicit space-time surrogate function coefficients.

11. The method of claim 1, wherein the method includes using a design of experiments method for at least one of: determining the range of time values, determining a range of values for at least one of the preselected variables, and validating the explicit space-time surrogate model.

12. The method of claim 1, wherein the method includes obtaining new information and determining whether or not to update the explicit space-time surrogate model responsive to the new information.

13. The method of claim 1, wherein the method includes displaying the explicit space-time surrogate model.

14. A method for modeling transitory behavior within a subsurface region by a method comprising the steps of:

generating a surrogate model of a full-physics model of a subsurface region for preselected variables at a first time value and determining a corresponding surrogate model coefficient for the first time value;

repeating the generating n times for n additional time values that are different than the first time value, wherein n is an integer greater than 1, wherein the first time value and the n additional time values define a range of time values and creating a matrix of surrogate model coefficients over the range of time values;

generating a time-varying function related to at least a portion of the matrix of surrogate model coefficients; and thereafter, providing non-transitory computer readable instructions to a computer processor to cause the computer processor to create an explicit space-time surrogate model of the full physics model based on (1) the surrogate models produced by the generating and the repeating, and (2) the generated time-varying function, wherein the created explicit space-time surrogate model is parametric for at least the preselected variables and also indicates changes in the preselected variables over at least the range of time values.

15. A method for extracting hydrocarbons from a subsurface region, the method comprising:

providing non-transitory computer readable instructions to a computer processor to cause the computer processor to generate a surrogate model of a full-physics model of a subsurface region for preselected variables at a first time value within a range of time values within at least a portion of the full physics model and determining a corresponding surrogate model coefficient for the first time value;

repeating the generating n times for n additional time values that are different than the first time value, wherein n is an integer greater than 1, wherein the first time value and the n additional time values define a range of time values; and creating a matrix of surrogate model coefficients over the range of time values;

thereafter creating an explicit space-time surrogate model of the at least a portion of the full physics mode based on (1) the surrogate models produced by the generating and the repeating and (2) the generated at least one time-varying function, wherein the space-time surrogate model is parametric for at least the preselected variables and also indicates changes in the variables over at least the range of time values; and extracting the hydrocarbons from the subsurface region based at least in part on the created explicit space-time surrogate model of the full physics model.

* * * * *